(12) United States Patent
Nichols et al.

(10) Patent No.: US 8,325,488 B2
(45) Date of Patent: Dec. 4, 2012

(54) CARD MODULE AND MODULE CONNECTOR ASSEMBLY

(75) Inventors: Robert Paul Nichols, Santa Rosa, CA (US); Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 230 days.

(21) Appl. No.: 12/832,501

(22) Filed: Jul. 8, 2010

(65) Prior Publication Data

US 2012/0008292 A1    Jan. 12, 2012

(51) Int. Cl.
*H05K 5/00* (2006.01)
(52) U.S. Cl. .................. 361/756; 361/727; 361/759
(58) Field of Classification Search .............. 361/727, 361/681, 756, 754, 759, 796, 800
See application file for complete search history.

(56) References Cited

U.S. PATENT DOCUMENTS

| | | | |
|---|---|---|---|
| 6,166,917 A * | 12/2000 | Anderson | 361/756 |
| 6,178,098 B1 | 1/2001 | Flickinger et al. | |
| 6,264,499 B1 | 7/2001 | Costello et al. | |
| 6,700,778 B1 * | 3/2004 | Wang | 361/690 |
| 7,099,160 B1 * | 8/2006 | Ice | 361/802 |
| 7,210,586 B2 * | 5/2007 | Ice | 211/26 |
| 7,871,294 B2 * | 1/2011 | Long | 439/541.5 |

* cited by examiner

*Primary Examiner* — Hung S Bui

(57) ABSTRACT

An electrical assembly includes a card module having a front end connector and an opposite back end connector. The card module is configured to be removably inserted into an opening formed in a front face of an electronic device. A header is mounted on a circuit board of the electronic device. The header has an electrical contact electrically coupled to the circuit board. The electrical contact is configured to engage the back end connector of the card module. A rail system extends between the header and the opening formed in the front face of the electronic device. The rail system is configured to receive the card module inserted into the opening and align the back end connector of the card module with the electrical contact of the header so that the back end connector engages the electrical contact. The card module is removable from the rail system through the opening.

19 Claims, 6 Drawing Sheets

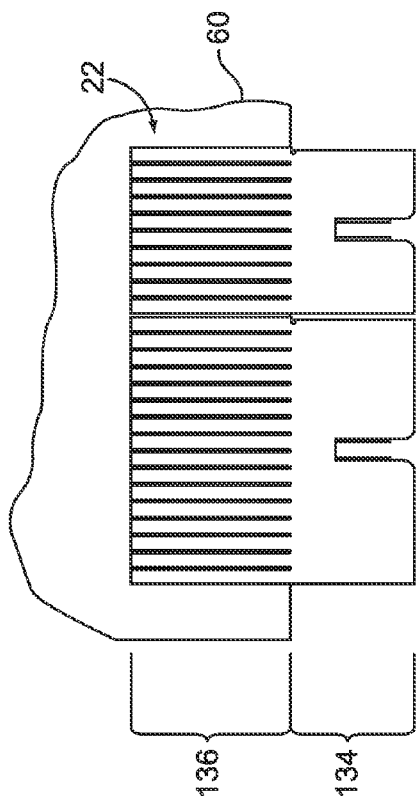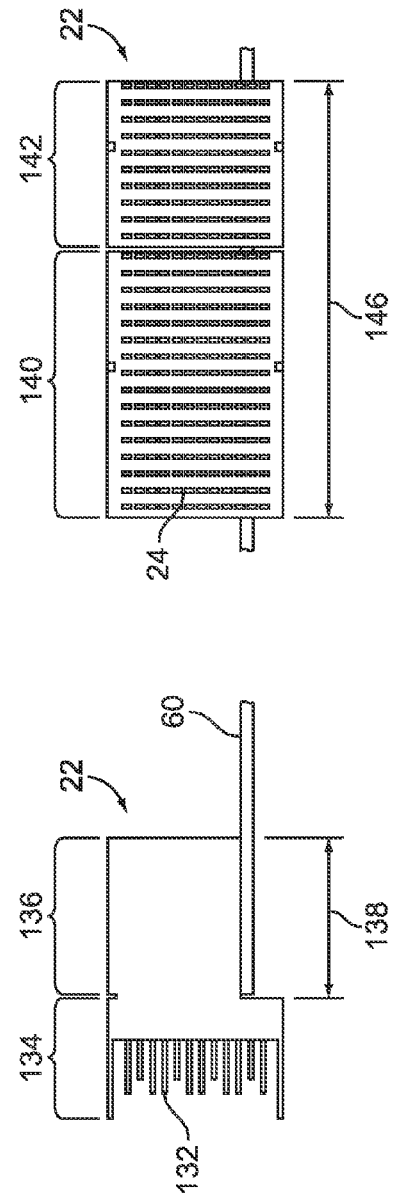

CARD MODULE AND MODULE CONNECTOR ASSEMBLY

BACKGROUND OF THE INVENTION

The subject matter described herein relates generally to a card module and, more particularly, to a card module and module connector assembly.

Electronic devices generally include connectors to receive input and output card modules. The input and output card modules are configured to transmit and receive data and/or power signals from external devices. In particular, the card modules include a front connector that extends from a front face of the electronic device. The front connector includes a jack and/or plug that connects to the external device. A back connector of the card module is configured to engage an electrical connector mounted on a circuit board of the electronic device. Accordingly, the external devices communicates with the electronic device through the card module.

However, known card modules are not without deficiencies. Existing card modules generally are not adaptable to alternative functions. To change the function of a card module, for example, to change the front and/or back connector of the card module, typically requires the card module to be replaced. Moreover, the electrical contacts provided in the electronic device may not be compatible with a new card module. Additionally, certain card modules require significantly more space within the electronic device. For example, high speed connectors create a larger footprint on the circuit board of the electronic device. As such, some electronic devices are not capable of utilizing high speed connectors.

A need remains for a higher density card module that provides high speeds without the need for a specific high speed input/output connector. Another need remains for a card module that is adaptable without increasing a size of the module and/or reconfiguring the electrical contacts of the electronic device.

SUMMARY OF THE INVENTION

In one embodiment, an electrical assembly for an electronic device is provided. The assembly includes a card module having a front end connector and an opposite back end connector. A card extends between the front end connector and the back end connector. The card module is configured to be removably inserted into an opening formed in a front face of the electronic device. A header is mounted on a circuit board of the electronic device. The header has at least one contact electrically coupled to the circuit board. The electrical contact is configured to engage the back end connector of the card module. A rail system extends between the header and the opening formed in the front face of the electronic device. The rail system is configured to receive the card module inserted into the opening and to align the back end connector of the card module with the electrical contact of the header so that the back end connector engages the electrical contact. The card module is removable from the rail system through the opening.

In another embodiment, a card module for an electronic device is provided. The card module includes a front end connector that is configured to receive a cable connector of an external device and a high speed connector configured to engage a header of the electronic device. A card extends between the front end connector and the high speed connector. The front end connector and the high speed connector are joined to the card. The card is configured to transmit signals between the front end connector and the high speed connector.

In another embodiment, an electronic device is provided. The electronic device includes a housing having a body with a front face. An opening extends through the front face. A circuit board is positioned within the housing and accessible through the opening in the front face. A header is mounted on the circuit board. A card module is provided having a front end connector and an opposite back end connector mated to the header. The card module is configured to be removably inserted into the opening. A rail system extends between the header and the opening, wherein the rail system receives the card module when inserted into the opening and aligns the back end connector of the card module with the header so that the back end connector engages the header. The card module is removable from the fail system through the opening.

BRIEF DESCRIPTION OF THE DRAWINGS

FIG. 8 is a top view of the header, shown in FIGS. 1 and 2.

FIG. 9 is a side view of the header, shown in FIGS. 1 and 2.

FIG. 10 is a front view of the header shown in FIGS. 1 and 2.

DETAILED DESCRIPTION OF THE INVENTION

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
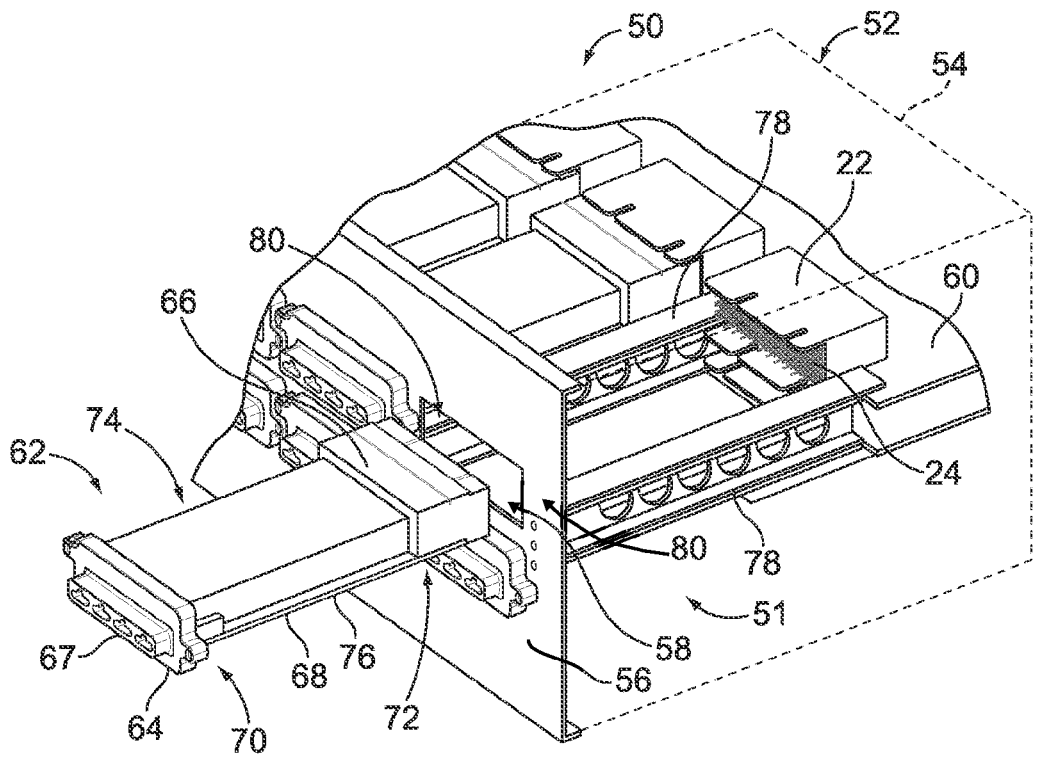
FIG. 1 is a view of an electronic device and a card module formed in accordance with an embodiment.
Figure 2:
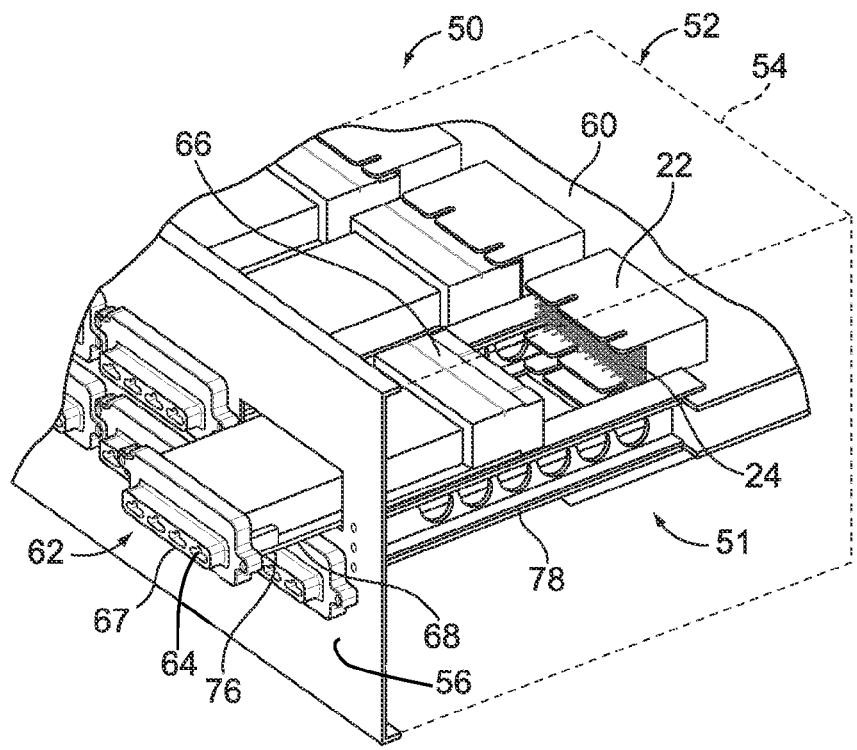
FIG. 2 is a view of the card module, shown in FIG. 1, being inserted into the electronic device, shown in FIG. 1.

FIG. 1 illustrates an electronic device 50 and a card module 62 formed in accordance with an embodiment. FIG. 2 illustrates the card module 62 being inserted into the electronic device 50. The electronic device 50 may be an input/output device configured to both transmit and receive data and/or power signals. The electronic device 50 is configured to operate with an electrical assembly 51. The electrical assembly includes the card module 62, a header 22, and a rail system 78. The header 22 and the rail system 78 are coupled within the electronic device 50. The card-module 62 is configured to be inserted into the electronic device 50 and engage the rail system 78 and the header 22. The electronic device 50 is configured to couple to at least one external device. The electronic device 50 may couple to the external device through a fiber optic based connection, a copper based connection, or the like. The electronic device 50 includes a housing 52 having a body 54. The housing 52 encloses and protects the electronic components of the electronic device 50. The body 54 includes a front face 56. The front face 56 may be formed integrally with the body 54 or may be configured to be removable from the body 54. In an exemplary embodiment, the front face 56 is a bezel configured to include input/output jacks that are electronically coupled to the electronic components of the electronic device 50. The front face 56 has an opening 58 extending therethrough. The front face 56 may include any number of openings 58. The number of openings 58 may correspond to a number of input/output jacks required for the electronic device 50.

A substrate 60 is positioned within the housing 52. The substrate 60 is accessible through the opening 58 in the front face 56. The substrate 60 may be a circuit board or a printed circuit board. The substrate 60 may be a backplane circuit board, a midplane circuit board, a motherboard, or a daughter card. The substrate 60 is configured to have electrical components of device 50 mounted thereon. For example, the header 22 is mounted on the substrate 60. The substrate 60 may include any number of headers 22 mounted thereon. The header 22 is surface mounted to the substrate 60. The header may be press-fit mounted or soldered to the substrate. The header 22 includes an array of electrical contacts 24 that are electrically coupled to the substrate 60. In one embodiment, the header 22 is a high speed connector, for example, a high speed back plane connector or a high speed coplanar connector. Optionally, the header 22 may be any other acceptable connector. The header 22 is aligned with an opening 58 formed in the front face 56.

The card module 62 includes a front end connector 64 and an opposite back end connector 66. The card module 62 may be a transceiver capable of transmitting and receiving data and/or power signals. Optionally, the card module 62 may be any other suitable electronic module. The front end connector 64 includes at least one connector 67 configured to receive a cable from an external device. The connector 67 may be a jack or a plug. The connector 67 may be configured for a fiber optic based connection, a copper based connection, or the like. For example, the connector 67 may be a 24 position fiber optic connector. The back end connector 66 is configured to be compatible with the header 22. For example, the back end connector 66 may be a high speed backplane connector or a high speed coplanar connector. The back end connector 66 is selected based on a pre-determined function of the card module 62.

A card 68 extends between the front end connector 64 and the back end connector 66. The card 68 may be a circuit board or a printed circuit board. The card 68 includes a front end 70, a back end 72, and a body 74 extending therebetween. The body 74 includes side edges 76 extending between the front end 70 and the back end 72. The card 68 includes conductive pathways extending through the body 74 to transmit signals between the front end connector 64 and the back end connector 66. The body 74 of the card 68 is configured to have electrical components mounted thereon. For example, an optical to electrical transform device and/or a high speed signal routing device may be mounted on the body 74.

The front end connector 64 may be surface mounted to the front end 70 of the card 68 and the back end connector 66 may be surface mounted to the back end 72 of the card 68. The front end connector 64 and the back end connector 66 may also be press-fit, soldered, or the like to the card 68. The front end connector 64 may be removable from the card 68 and interchangeable with other front end connectors 64 that may have different configurations.

The card module 62 is configured to be removably inserted into the opening 58, as illustrated in FIG. 2. The card module 62 is inserted so that back end connector 66 of the card module 62 mates with the header 22. A rail system 78 extends between the header 22 and the opening 58. A rail system 78 is provided on each side 80 of the opening 58. The rail systems 78 are configured to receive the card module 62 as the card module 62 is inserted into the opening 58. Each rail system 78 includes a guide rail 82 (Shown in FIG. 3) that engages the side edges 76 of the card module 62. The rail systems 78 align the back end connector 66 of the card module 62 with the electrical contact 24 of the header 22. The card module 62 is slid along the guide rails 82 so that the back end connector 66 engages the electrical contact 24 of the header 22. In an exemplary embodiment, each rail system 78 includes two guide rails 82. The guide rails 82 are coupled with a beam 84 (shown in FIG. 3). The guide rails 82 extend parallel to one another so that two card modules 62 can be stacked one on of top the other. Optionally, each rail system 78 may include any number of guide rails 82 to stack any number of card modules 62.

The card module 62 is removable from the rail system 78 through the opening 58. FIG. 1 illustrates the card module 62 positioned outside the electronic device 50. FIG. 2 illustrates the card module 62 partially inserted into the electronic device 50. The header 22 provides a connector between the card module 62 and the electronic device 50. The card module 62 is configured to receive and transmit data signals between an external device coupled to the front end connector 64 and the electronic device 50. For example, the front end connector 64 may receive fiber optic signals from the external device. The fiber optic signals are then converted to electrical signals by an electronic component mounted to the card 68. The electrical signals are transmitted through the back end connector 66 and the header 22 to the electronic device 50. Optionally, signals may be transmitted from the electronic device 50 to the external device.

The rail system 78 allows the card module 62 to be removed from the electronic device 50 and replaced with a card module 62 having a different configuration. The interchangeability of the card module 62 provides a connector with the electronic device 50 that is capable of receiving various inputs and outputs while utilizing a high speed connector as the back end connector 66. For example, the card module 62 may be configured for a fiber optic based connection, a copper based connection, or the like. The card module 62 may be removable from the electronic device 50 and interchangeable with another card module 62 having a different front end connector 64. In one embodiment, the card module 62 may be removable from the electronic device 50 and interchangeable with another card module 62 having different electronic components. In another embodiment, the electrical components of the card module 62 may be removable from the card module 62 and interchangeable with other components.

Figure 3:
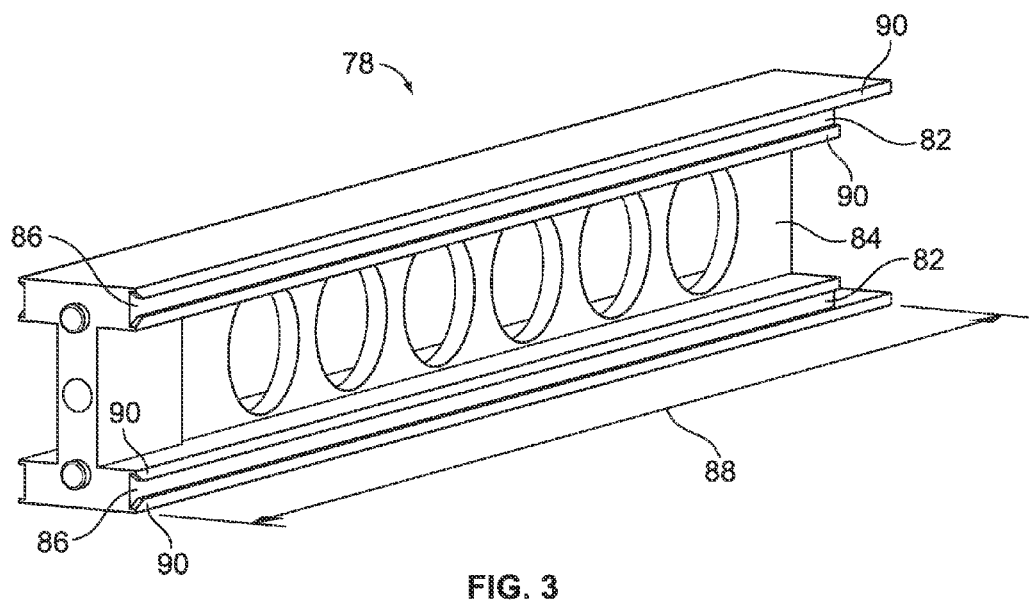
FIG. 3 is a view of the rail system, shown in FIGS. 1 and 2.

FIG. 3 illustrates the rail system 78. The rail system 78 may be surface mounted to the substrate 60. Optionally, the rail system 78 may be joined to the front face 56 of the electronic device 50. The rail system 78 includes a pair of guide rails 82. The guide rails 82 are coupled by a beam 84. The rail system 78 is illustrated having two guide rails 82. The guide rails 82 are positioned one on top of the other. The guide rails 82 extend in parallel. The guide rails 82 are positioned so that two card modules 62 can be received by the rail system 78. The card modules 62 are received one on top of the other and are configured to be positioned in parallel within the electronic device 50. The card modules 62 are configured to engage headers 22 that are stacked one on top of the other within the electronic device 50.

The guide rails 82 include a slot 86 extending the length 88 thereof. The slot 86 is defined by flanges 90 that extend at an angle from the guide rail 82. Alternatively, the flanges 90 may extend orthogonally from the guide rail 82. The slot 86 is configured to receive one of the side edges 76 of the card module 62. The side edge 76 is retained by the flanges 90 and slides through the slot 86 when the card module 62 is inserted into or removed from the electronic device 50. In one embodiment, the flanges 90 may include a surface having a reduced friction to enable the card module 62 to slide there along. Optionally, the flanges 90 may be lubricated to reduce friction between the card module 62 and the flanges 90 as the card module 62 is moved along the guide rail 82. In another embodiment, the slot 86 may include ball bearings or the like to reduce the friction between the guide rail 82 and the side edge 76 of the card module 62. The rail system 78 includes two guide rails 82 that extend in parallel. The rail system 78 is configured to be positioned between two card modules 62. Each guide rail 82 is configured to receive one of the card modules 62 to guide each card module 62 to a respective header 22.

Figure 4:
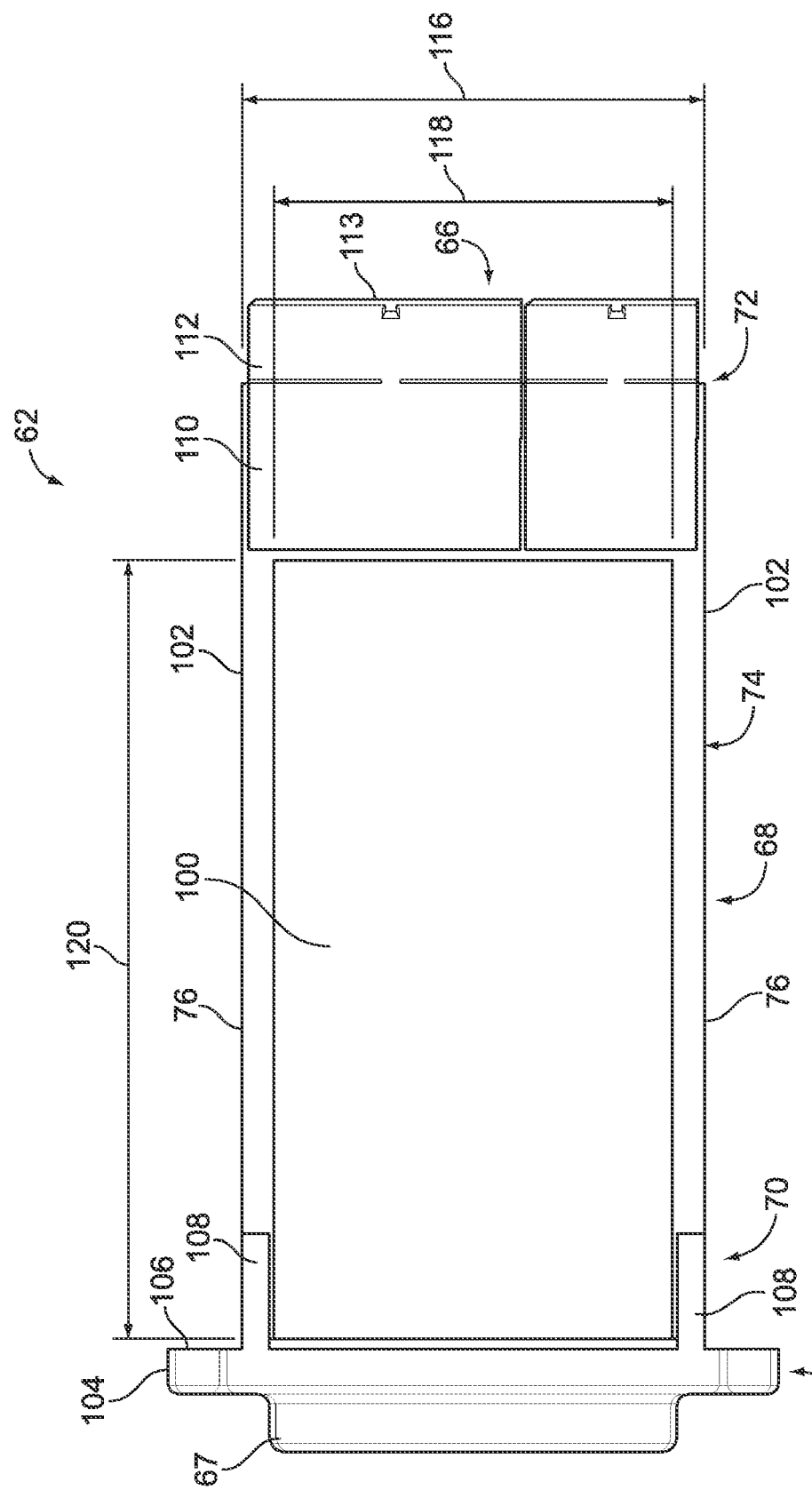
FIG. 4 is a top view of the card module, shown in FIGS. 1 and 2.
Figure 5:
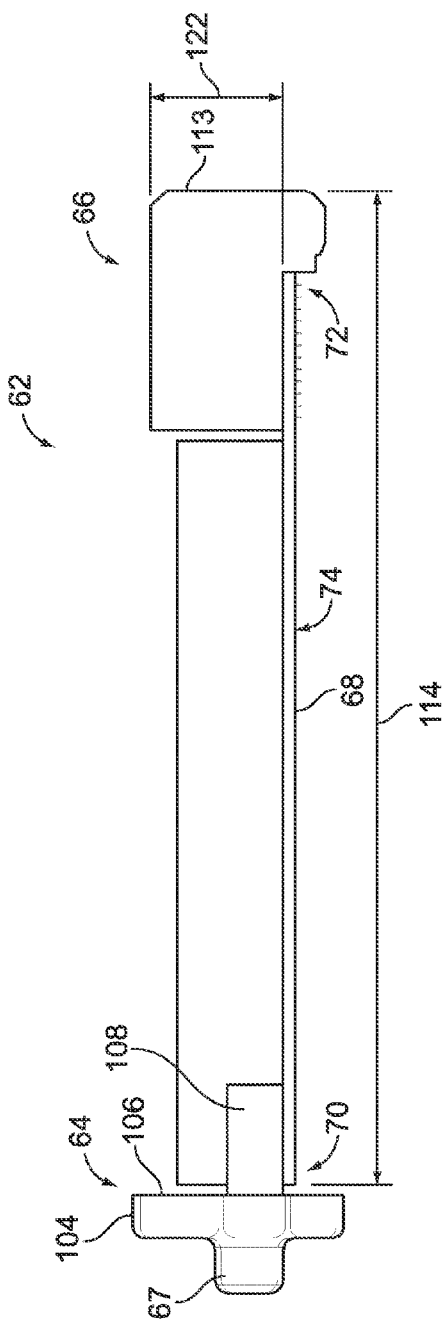
FIG. 5 is a side view of the card module 62, shown in FIGS. 1 and 2.
Figure 6:
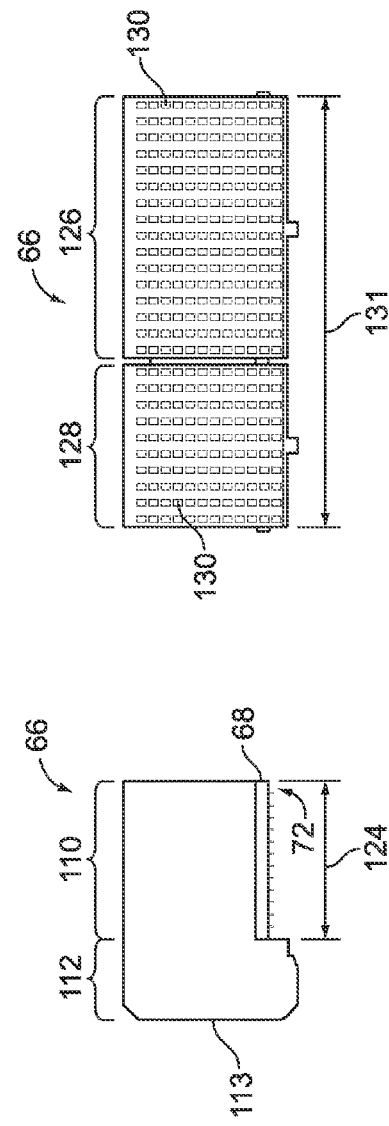
FIG. 6 is a side view of the back end connector, shown in FIGS. 1 and 2.

FIG. 4 illustrates a top view of the card module 62. FIG. 5 illustrates a side view of the card module 62. FIG. 6 illustrates a side view of the back end connector 66 coupled to the card 68. The card module 62 includes the front end connector 64 and the back end connector 66. The components are mounted within a mounting area 100 of the card 68. The components may be removably mounted to the card 68. The components are removable and interchangeable with other components. The side edges 76 of the card 68 extend along the edges 102 of the mounting area 100. The side edges 76 are configured to be received by the rail system 78 when the card module 62 is inserted into the electronic device 50. Optionally, a guide rail can be mounted to the card module 62 to provide the interface between the card 68 and the rail system 78.

The connector 67 extends from a plate 104. The plate 104 includes a rear surface 106. The rear surface 106 is configured to rest against and mount to the front face 56 (shown in FIGS. 1 and 2) of the electronic device 50. The plate 104 may be screwed into or otherwise secured to the front face 56. Flanges 108 extend from the rear surface 106 of the plate 104. The flanges 108 engage the front end 70 of the card 68. The flanges 108 may be surface mounted, press-fit, soldered, or the like to the card 68. The front end connector 64 may be removably coupled to the card 68 so that the front end connector 64 is interchangeable with other front end connectors 64. For example, the front end connector 64 may be interchangeable with another front end connector 64 having different jacks 67 and/or plugs.

The back end connector 66 includes a mounting end 110 and a mating end 112. The mating end 112 is configured to engage of the header 22. The mounting end 110 is mounted to the back end 72 of the card 68. The mounting end may be press-fit, soldered, surface mounted, or the like to the back end 72 of the card 68. The back end connector 66 is configured to be compatible with the electrical contact 24. For example, the back end connector 66 may be a high speed connector.

In one embodiment, the card module 62 has a length 114 of approximately 116.8 mm from the rear surface 106 of the plate 104 to the rear surface 113 of the back end connector 66, as illustrated in FIG. 5. The portion of the card module 62 from the rear surface 106 of the plate 104 to the rear surface 113 of the back end connector 66 is configured to be positioned within the electronic device 50. The plate 104 and the jacks 67 are positioned outside the electronic device 50. In an example embodiment, the card 68 has an approximate width 116 of 50.8 mm, as illustrated in FIG. 4. In one embodiment, the mounting area 100 of the card 68 may have an approximate width 118 of 44 mm and an approximate length 120 of 87.2 mm, as illustrated in FIG. 4. In an example embodiment, the back end connector 66 may extend a height 122 of 15.3 mm from the card 68, as illustrated in FIG. 5, and the mounting end 110 of the back end connector 66 may extend a length 124 of approximately 18.1 mm along the back end 72 of the card, as illustrated in FIG. 6. The card module 62 has a density that is configured to reduce a footprint of the module 62 with respect to the substrate 60. It should be noted that the lengths, widths, and heights described herein are exemplary only. In other embodiments, the card module 62 may include different lengths, widths, and heights that may be less than or greater than the lengths, widths, and heights described herein.

Figure 7:
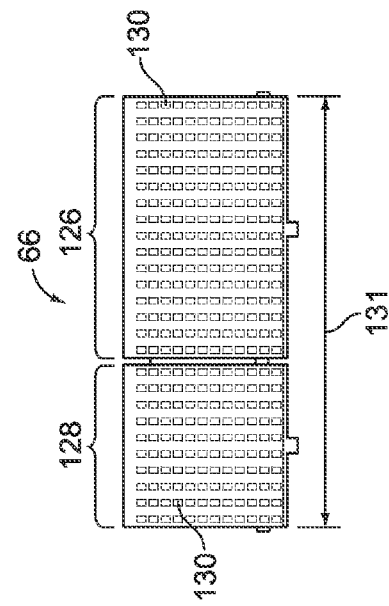
FIG. 7 is a front view of the back end connector, shown in FIGS. 1 and 2.

FIG. 7 is a front view of the back end connector 66. In an exemplary embodiment, the back end connector 66 includes pair of connectors 126 and 128. The connectors 126 and 128 are positioned adjacent to one another. The connectors 126 and 128 include slots 130 that are configured to receive the contacts 24 of the header 22. In an example embodiment, the connectors 126 and 128 have a combined width 131 of approximately 49.8 mm. Alternatively, the connectors 126 and 128 may have a combined width 131 that is less than or greater than 49.8 mm. In one embodiment, the connectors 126 and 128 are high speed connectors. Alternatively, the connectors 126 and 128 may be any suitable connectors. In the illustrated embodiment, the connector 126 is configured as a 4 pair by 16 column connector and the connector 128 is configured as a 4 pair by 10 column connector. Alternatively, the connectors 126 and 128 may be configured with any number of pairs and columns.

FIG. 8 is a top view of the header 22. FIG. 9 is aside view of the header 22. The header 22 includes a mating end 134 and a mounting end 136. The mounting end 136 is mounted to the substrate 60. The mounting end 136 may be press-fit, soldered, surface mounted, or the like to the substrate 60. In an exemplary embodiment, the mounting end 136 extends a length 138 of approximately 18.1 mm. across the substrate 60, as illustrated in FIG. 9. The header 22 may be a high speed connector and/or any other suitable connector. The electrical contacts 24 extend from the mating end 134 and are configured to be received in the slots 130 of the back end connector 66 when the card module 62 engages the header 22.

FIG. 10 illustrates a front view of the header 22. The header 22 includes connectors 140 and 142. The connectors 140 and 142 include the contacts 24 that are configured to be received in the slots 130 of connectors 126 and 128 when the back end connector 66 is coupled to the header 22. In the illustrated embodiment, the connectors 140 and 142 have a combined width 146 of approximately 49.8 mm. Alternatively, the connectors 140 and 142 may have a combined width 146 that is less than or greater than 49.8 mm. The width 146 of the header 22 is configured to reduce a footprint of the header 22 with respect to the substrate 60. In the illustrated embodiment, the connector 140 is configured as a 4 pair by 16 column connector. The connector 140 is configured to engage the connector 126 of the back end connector 66. In the illustrated embodiment, the connector 142 is configured as a 4 pair by 10 column connector. The connector 142 is configured to engage the connector 128 of the back end connector 66. Alternatively, the connectors 140 and 142 may be configured with any number of pairs and columns that corresponds to the number of pairs and columns of the connectors 126 and 128, respectively.

Figure 11:
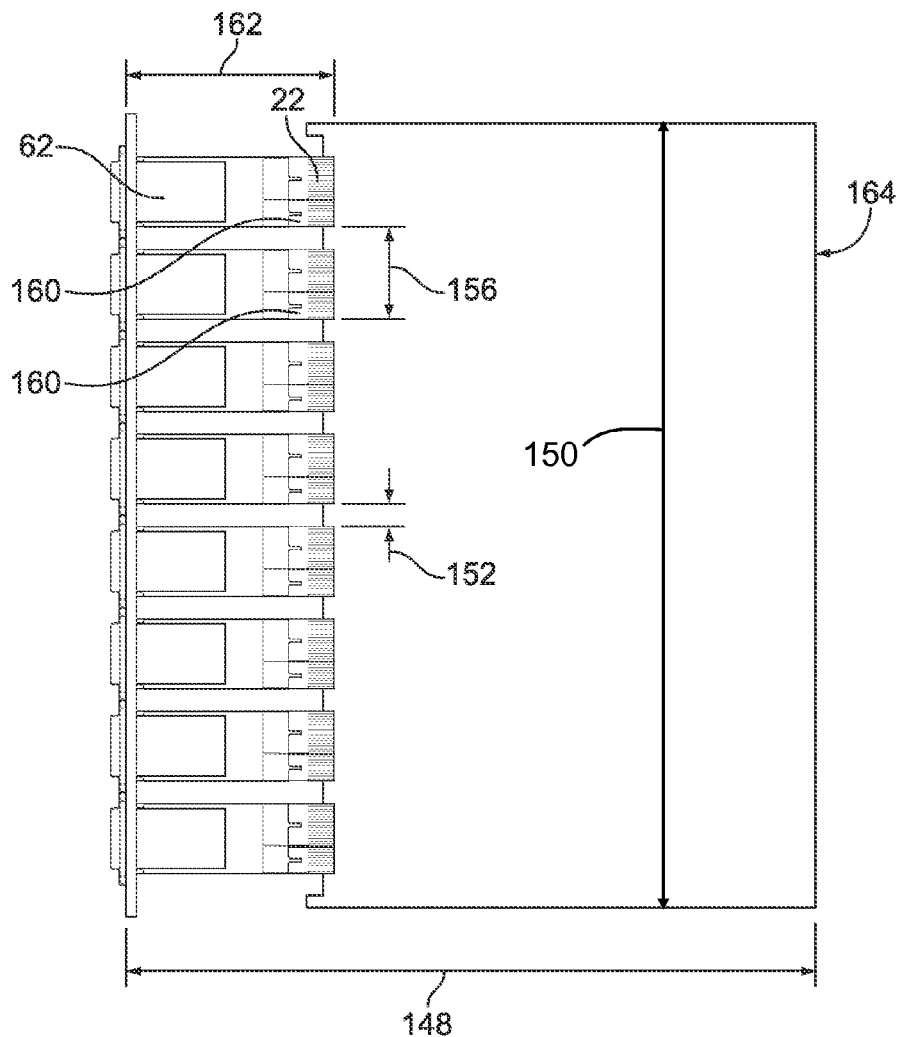
FIG. 11 is a view of the substrate, shown in FIGS. 1 and 2 having a plurality of card modules and headers coupled thereto.

FIG. 1 illustrates the substrate 60 having a plurality of card modules 62 and headers 22 coupled thereto. FIG. 11 illustrates the substrate 60 having eight headers 22 and card modules 62 coupled thereto. The substrate 60 may be configured to have any number of headers 22 mounted thereon. A card module 62 is configured to be engaged with each header 22. The headers 22 and card modules 62 are sized to reduce a footprint created by the headers 22 and card modules 62 on the substrate 60. In the illustrated embodiment, the substrate 60 has a width 148 of approximately 533 mm and a length 150 of approximately 457 mm.

Adjacent headers 22 are mounted on the substrate 60 with a gap 152 therebetween. In an example embodiment, the gap 152 is approximately 10.5 mm. In alternative embodiments, the headers 22 may be positioned with a larger or smaller gap 152. Each pair of adjacent headers 22 has a common gap 152. Alternatively, the gap 152 between each pair of adjacent headers 22 may vary. A pitch 156 is also provided between each header 22. The pitch 156 is defined from a first side 160 of a header 22 to a first side 160 of an adjacent header 22. In the illustrated embodiment, the pitch 156 is approximately 62 mm. Alternatively, the pitch 156 may be larger or smaller than 62 mm. Each pair of adjacent headers 22 has a common pitch 156. Alternatively, the pitch 156 between each pair of adjacent headers 22 may vary.

Each card module 62 has a footprint 162 that extends from the front face 56 of the electronic device 50 toward a back end 164 of the substrate 60. The footprint 162 is defined between the front face 56 and the rear surface 113 of the back end connector 66. In the illustrated embodiment, the footprint 162 is approximately 5.5 inches. Alternatively, the footprint 162 may be less than or greater than 5.5 inches. Each module 62 is illustrated with a common footprint 162. Alternatively, the footprint 162 of each module 62 may vary.

Figure 12:
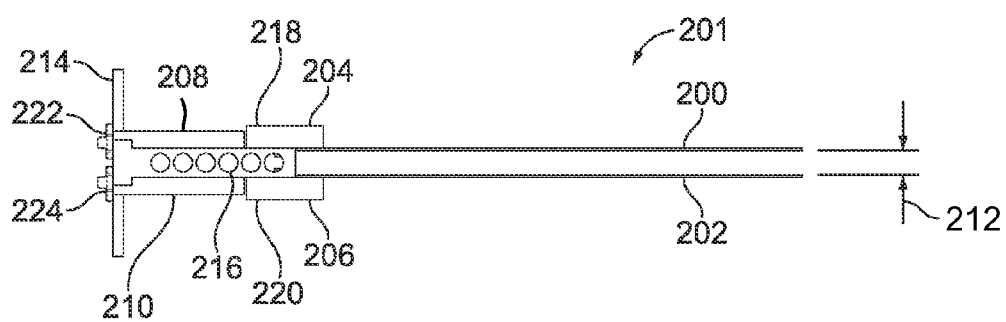
FIG. 12 is a side view of another electronic device formed in accordance with an embodiment.

FIG. 12 illustrates an electronic device 201 having a top substrate 200 stacked on top of a bottom substrate 202. The top substrate 200 and the bottom substrate 202 extend in parallel to one another. In the illustrated embodiment, the top substrate 200 and the bottom substrate 202 are separated by a distance 212 within a range of approximately 12 mm to 18 mm. Alternatively, the top substrate 200 and the bottom substrate 202 may be separated by a distance 212 less than 12 mm or a distance 212 greater than 18 mm. A top header 204 is coupled to the top substrate 200 and a bottom header 206 is coupled to the bottom substrate 202. A top card module 208 engages the top header 204 and a bottom card module 210 engages the bottom header 206. The top card module 208 and the bottom card module 210 extend parallel to one another.

The top card module 208 and the bottom card module 210 extend through respective openings (not shown) formed in a front face 214 of the electronic device 201. A rail system 216 extends between the top substrate 200 and the bottom substrate 202. The rail system 216 is positioned between the front face 214 and the headers 204 and 206. The card modules 208 and 210 extend along the rail system 216. The rail system 216 includes a top guide rail (not shown) and a bottom guide rail (not shown). The top card module 208 is slid along the top guide rail until it engages the top header 204. The bottom card module 210 is slid along the bottom guide rail until it engages the bottom header 206.

The card modules 208 and 210 are removable from the electronic device 201 so that the card modules 208 and 210 may be replaced with card modules having different configurations. The interchangeability of the card modules 208 and 210 provides a connector with the electronic device 201 that is capable of receiving various inputs and outputs while utilizing a high speed connector. The card modules 208 and 210 include front end connectors 222 and 224, respectively. In one embodiment, the card modules 208 and 210 may be removable from the electronic device 201 and interchangeable with other card modules having different front end connectors. The card modules 208 and 210 may also be removable from the electronic device 201 and interchangeable with other card modules having different electronic components. In another embodiment, the electrical components of the card modules 208 and 210 may be removable and interchangeable with other components.

The embodiments described herein provide a card module that incorporates high speed connectors to provide a connector between an electronic device and the card module. The card module is removable to interchange the components of the card module. For example, a front end connector and/or back end connector of the card module may be replaced. Optionally, the electrical components of the card module may be removable and interchangeable. The card module and the header that the card module engages are also configured to have a high density and reduce a footprint imposed on a substrate of the electronic device.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective term "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An electrical assembly for an electronic device, the electrical assembly comprising:
    a first card module having a front end connector and an opposite back end connector, a card extending between the front end connector and the back end connector, the first card module configured to be removably inserted into a first opening formed in a front face of the electronic device;
    a second card module having a front end connector and an opposite back end connector, a card extending between the front end connector and the back end connector, the second card module configured to be removably inserted into a second opening formed in the front face of the electronic device;
    a first header mounted on a first circuit board of the electronic device, the first header having an electrical contact electrically coupled to the first circuit board, the electrical contact configured to engage the back end connector of the first card module;
    a second header mounted on a second circuit board of the electronic device, the second circuit board spaced a distance from the first circuit board and extending generally parallel to the first circuit board, the second header having an electrical contact electrically coupled to the second circuit board, the electrical contact configured to engage the back end connector of the second card module; and
    a rail system extending between the first and second headers and the first and second openings formed in the front face of the electronic device, the rail system configured to receive the first and second card modules inserted into the first and second openings and to align the back end connectors of the first and second card modules with the electrical contacts of the first and second headers, respectively, so that the back end connectors of the first and second card modules engage the electrical contacts of the first and second headers, respectively, wherein the first card module electrically communicates with the first circuit board and the second card module electrically communicates with the second circuit board, the first and second card modules removable from the rail system through the first and second openings.

2. The electrical assembly of claim 1, wherein the rail system includes a first guide rail and a second guide rail extending above the first guide rail, the first guide rail configured to receive the first card module, the second guide rail configured to receive the second card module, the second card module extending above the first card module.

3. The electrical assembly of claim 1, wherein the back end connector of at least one of the first and second card modules is selected based on a pre-determined function of the card module.

4. The electrical assembly of claim 1, wherein the card of at least one of the first and second card modules has electronic components positioned thereon, the at least one of the first and second card modules removable from the rail system and interchangeable with another card module having different electronic components and the same back end connector.

5. The electrical assembly of claim 1, wherein the card of at least one of the first and second card modules has electronic components positioned thereon, the electrical components of the at least one of the first and second card modules interchangeable with other components.

6. The electrical assembly of claim 1, wherein the front end connector of at least one of the first and second card modules is interchangeable with another front end connector.

7. The electrical assembly of claim 1, wherein at least one of the first and second card modules includes a side edge that engages the rail system to align the back end connector of the at least one of the first and second card modules with the electrical contact of the respective first or second header.

8. The electrical assembly of claim 1, wherein the rail system includes a guide rail that receives a side of at least one of the first and second card modules to align the back end connector of the at least one of the first and second card modules with the electrical contact of the respective first or second header.

9. The electrical assembly of claim 1, wherein the rail system includes two guide rails, the rail system positioned between the first and second card modules, each guide rail of the rail system configured to receive one of the card modules to guide each card module to a respective header.

10. The electrical assembly of claim 1, wherein the back end connector of at least one of the first and second card modules includes a high speed connector.

11. The electrical assembly of claim 1, wherein the front end connector of at least one of the first and second card modules is at least one of a copper connector or a fiber optic connector.

12. A card module for an electronic device, the card module comprising:
    a front end connector that is configured to receive a cable connector of an external device;
    a high speed connector configured to engage a header of the electronic device; and
    a card extending between the front end connector and the high speed connector, the front end connector and the high speed connector joined to the card, the card configured to transmit signals between the front end connector and the high speed connector, wherein the card includes electrical components that are interchangeable with other electrical components.

13. The card module of claim 12, wherein the card comprises a printed circuit board.

14. The card module of claim 12, wherein the card includes electronic devices configured to perform optical to electrical transformation.

15. The card module of claim 12, wherein the card includes high speed signal routing devices mounted thereon.

16. An electronic device comprising:
    a housing having a front face, first and second openings extending through the front face;
    a first circuit board positioned within the housing and accessible through the first opening in the front face;
    a second circuit board positioned within the housing and accessible through the second opening in the front face, the second circuit board spaced a distance from the first circuit board and extending generally parallel to the first circuit board;
    a first header mounted on the first circuit board;
    a second header mounted on the second circuit board;
    a first card module having a front end connector and an opposite back end connector configured to be mated to the first header, the first card module configured to be removably inserted into the first opening;
    a second card module having a front end connector and an opposite back end connector configured to be mated to the second header, the second card module configured to be removably inserted into the second opening; and a rail system extending between the first and second headers and the first and second openings, wherein the rail system receives the first and second card modules when inserted into the first and second openings, respectively, and aligns the back end connectors of the first and second card modules with the first and second headers, respectively, so that the back end connector engages the respective header, the first and second card modules removable from the rail system through the first and second openings.

17. The electronic device of claim 16, wherein the back end connector of at least one of the first and second card modules includes a high speed connector.

18. The electronic device of claim 16, wherein at least one of the first and second card modules includes electronic components, the electronic components interchangeable with other electronic components.

19. The electronic device of claim 16, wherein the front end connector of at least one of the first and second connectors includes at least one of a fiber optic connector or a copper connector.

* * * * *